(12) United States Patent
Sudhindranath et al.

(10) Patent No.: US 6,338,972 B1
(45) Date of Patent: Jan. 15, 2002

(54) OFF-GRID METAL LAYER UTILIZATION

(75) Inventors: Sira G. Sudhindranath, Milpitas; Anand Sethuraman, Santa Clara, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/693,014

(22) Filed: Oct. 20, 2000

Related U.S. Application Data

(62) Division of application No. 09/183,292, filed on Oct. 30, 1998, now Pat. No. 6,179,742.

(51) Int. Cl.[7] .......................... G01R 31/26; H01L 21/66; H01L 2/182; G06F 17/50
(52) U.S. Cl. .......................... 438/14; 438/128; 438/129; 716/13; 716/15
(58) Field of Search .......................... 438/14, 128, 129, 438/598, 599; 364/490, 491; 716/13, 15

(56) References Cited

U.S. PATENT DOCUMENTS

| | | | | |
|---|---|---|---|---|
| 5,587,923 A | * | 12/1996 | Wang .......................... | 364/490 |
| 5,870,313 A | * | 2/1999 | Boyle et al. .................. | 364/491 |
| 5,980,093 A | * | 11/1999 | Jones et al. .................. | 364/489 |
| 6,182,272 B1 | * | 1/2001 | Andreev et al. .............. | 716/13 |
| 6,225,143 B1 | * | 5/2001 | Rao et al. .................... | 438/106 |

\* cited by examiner

Primary Examiner—John F. Niebling
Assistant Examiner—Walter L. Lindsay, Jr.
(74) Attorney, Agent, or Firm—Mitchell, Silberberg & Knupp LLP

(57) ABSTRACT

Routing of electrical connections between cells arranged in cell columns on an integrated circuit (IC) die. Electrical connections are routed on a routing layer between cells located in a first cell column. An identification is made of an available off-grid resource capable of being used for wire routing that is both within the first cell column and on the routing layer. An electrical connection is routed between a first cell and a second cell located in different cell columns using at least a portion of the identified available off-grid resource. Also, an integrated circuit die which includes vertical power rails and vertical ground rails. Cell columns, including a first cell column and a second cell column, are each bordered by a vertical power rail and a vertical ground rail. A channel is provided between the first cell column and the second cell column. An electrical connection is provided between a first electronic component in the first cell column and a second electronic component in the second cell column. The electrical connection includes an on-grid wire segment in the channel between the first cell column and the second cell column and an off-grid wire segment formed in one of the cell columns.

6 Claims, 9 Drawing Sheets

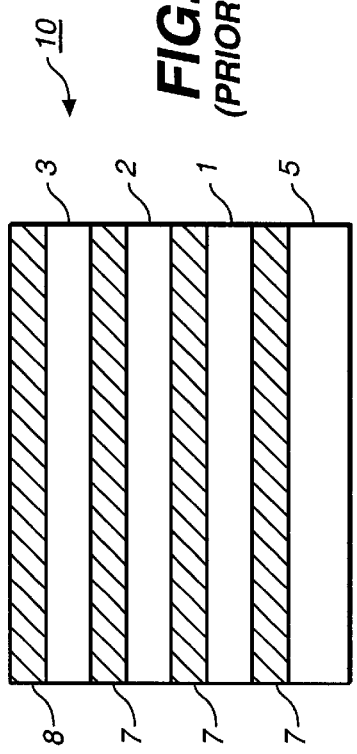
FIG._1
(PRIOR ART)
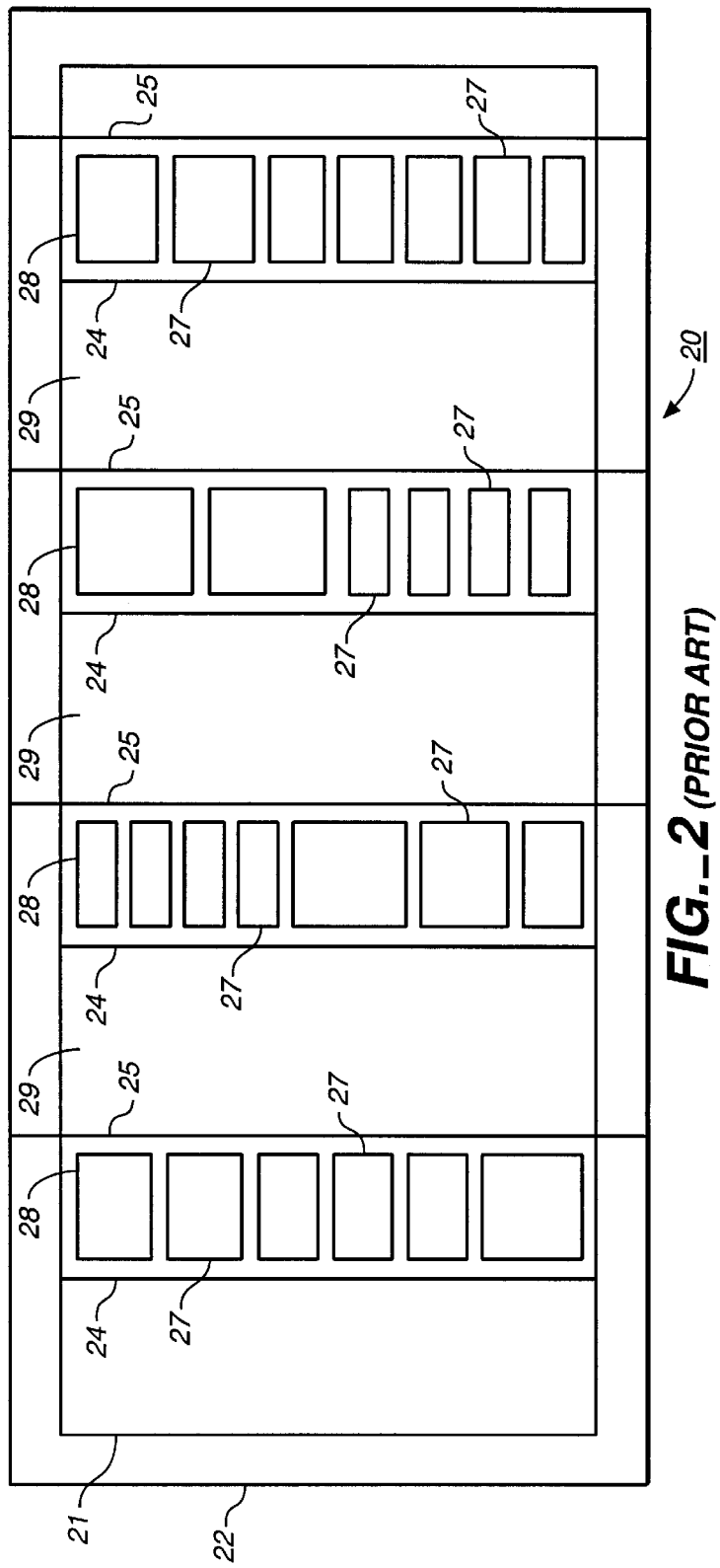
FIG._2 (PRIOR ART)

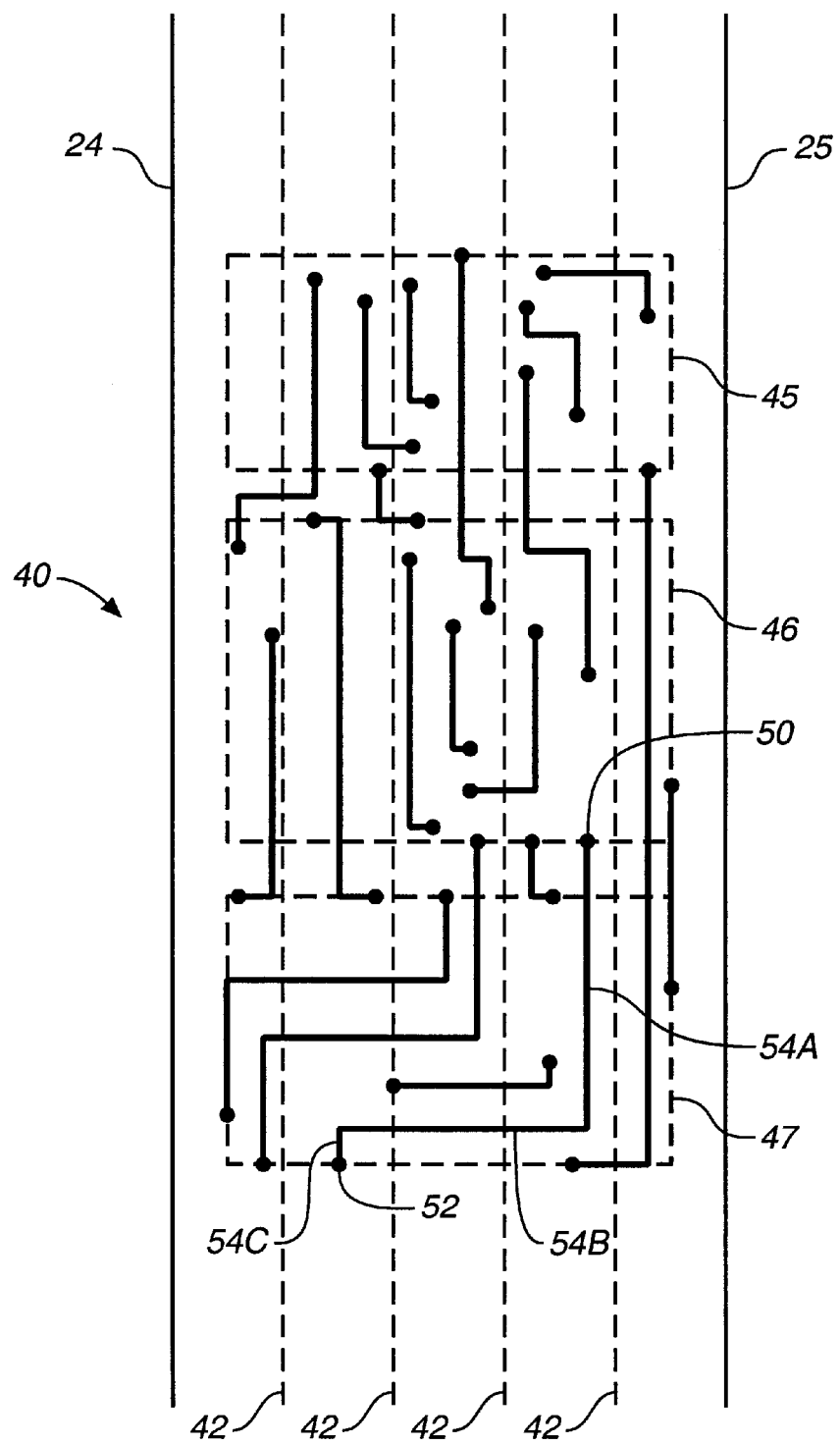
FIG._3A
*(PRIOR ART)*

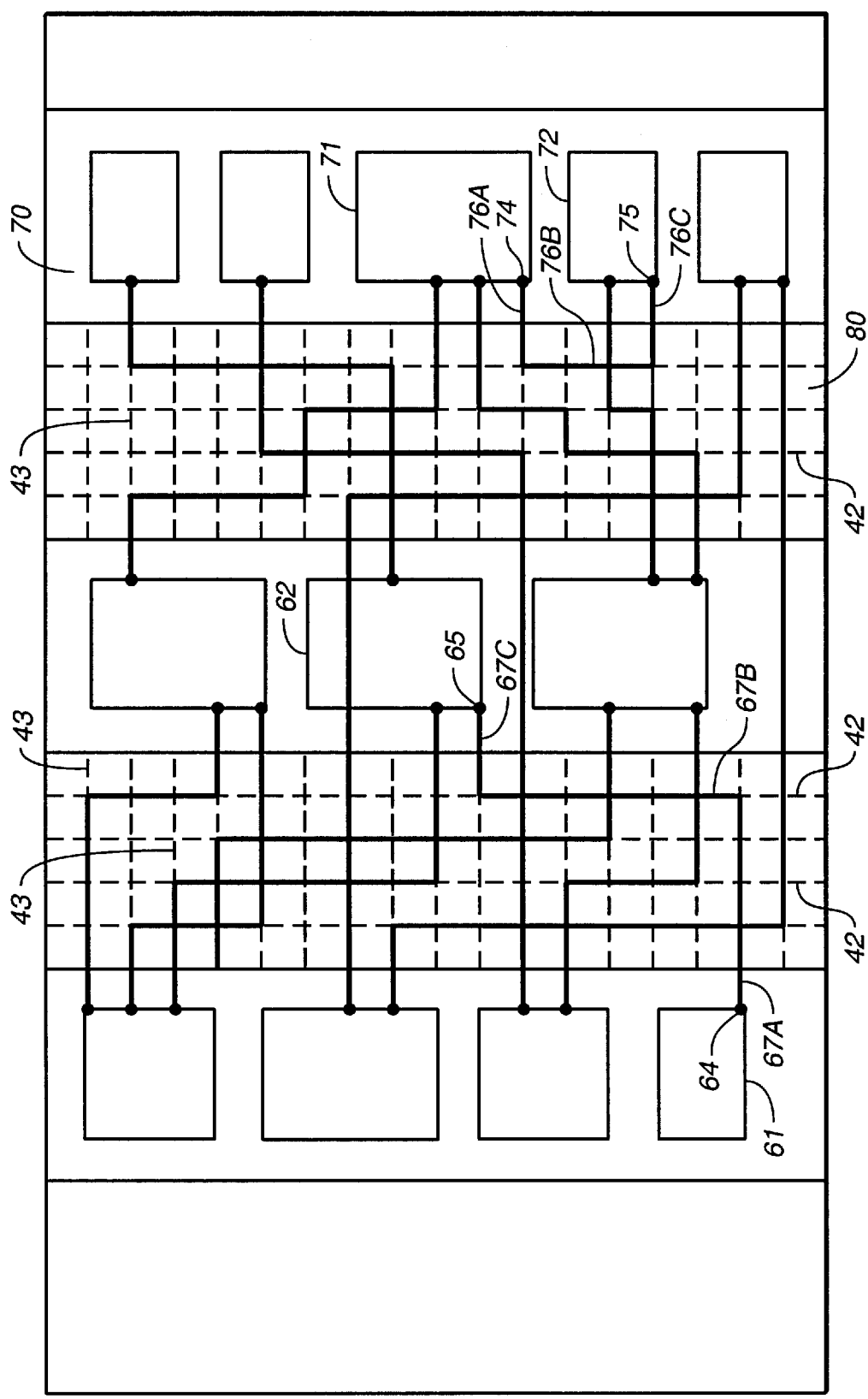
FIG._3B
(PRIOR ART)

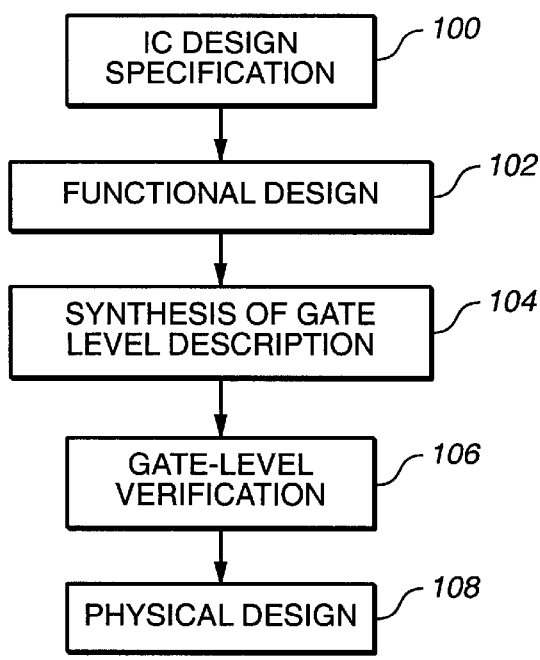
FIG._4
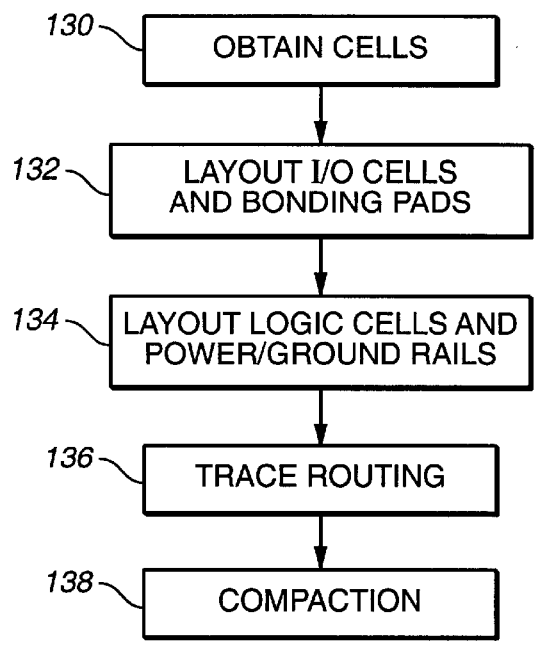
FIG._5
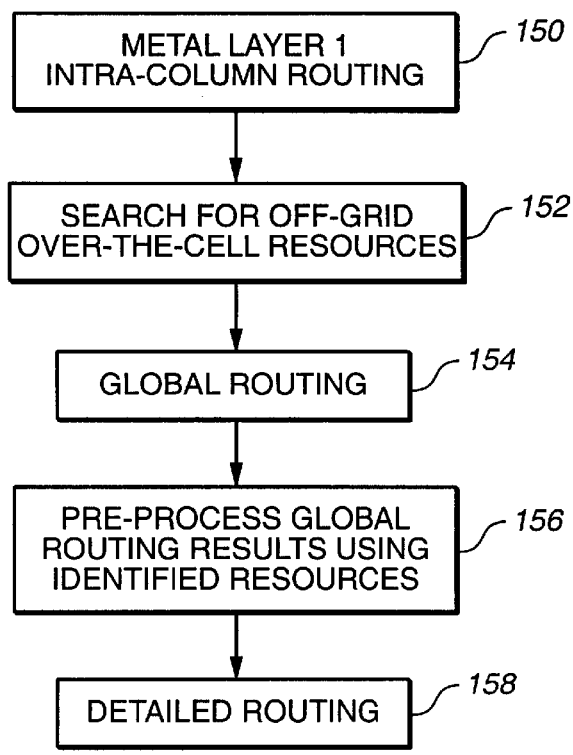
FIG._6

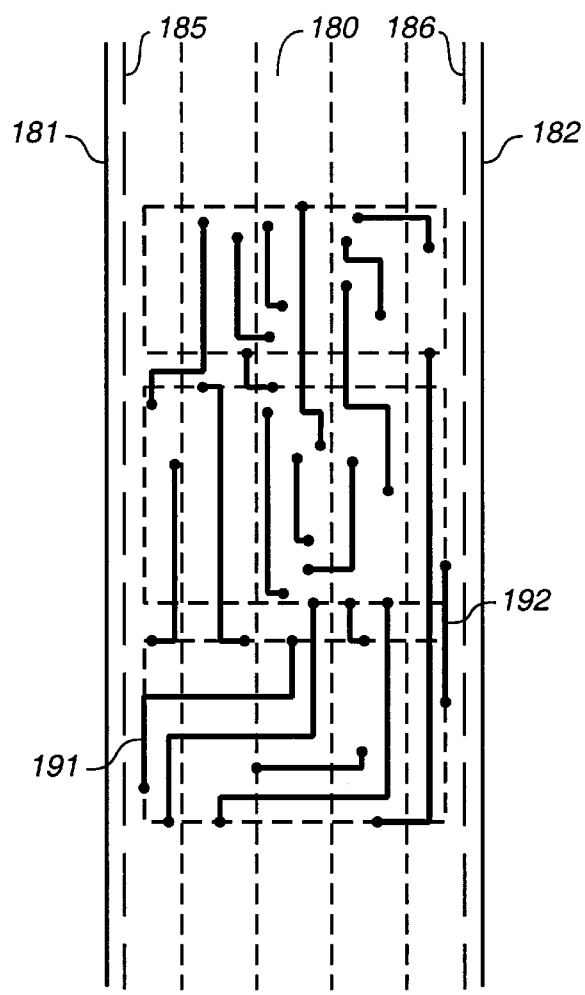
FIG._7A
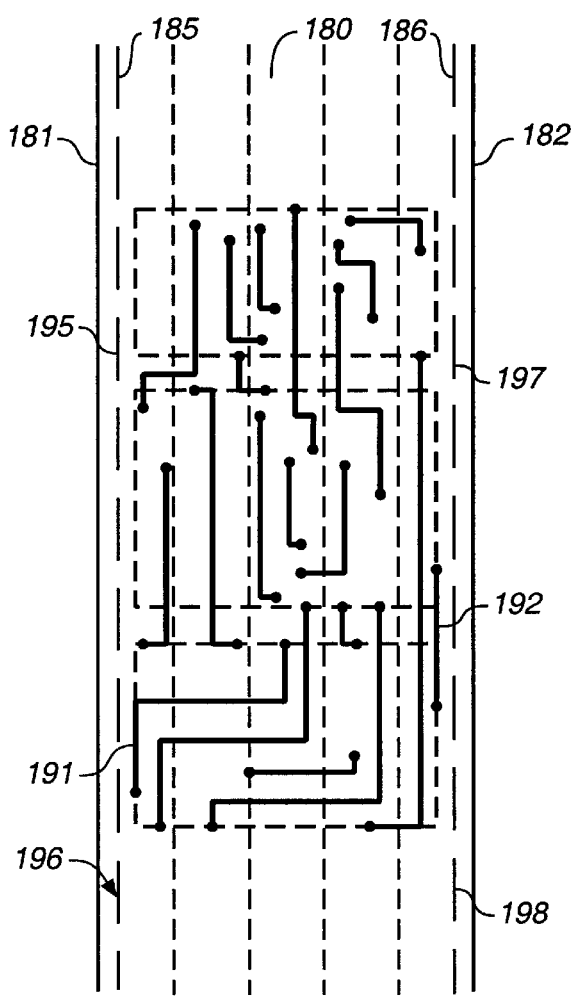
FIG._7B

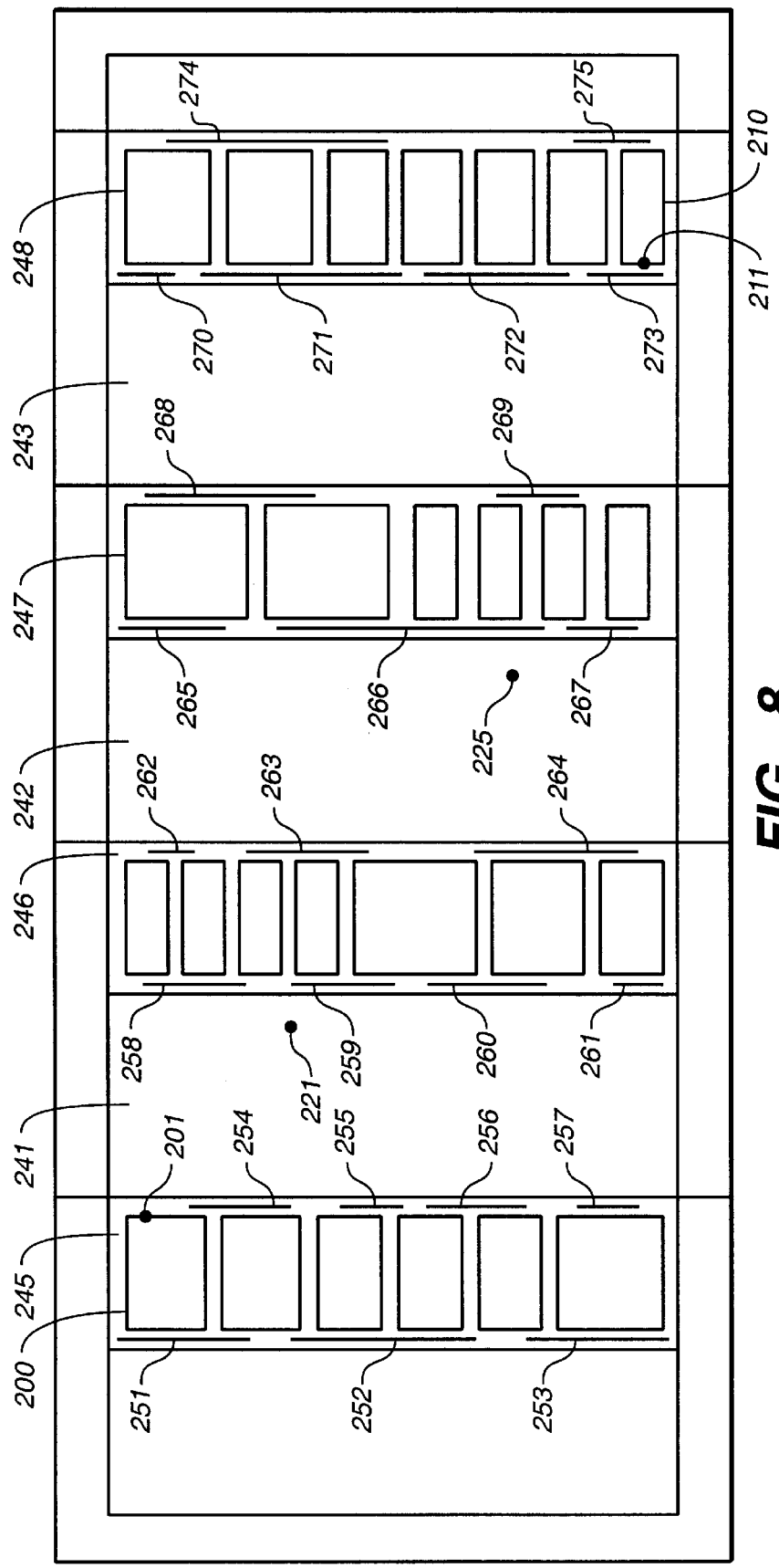
FIG._8

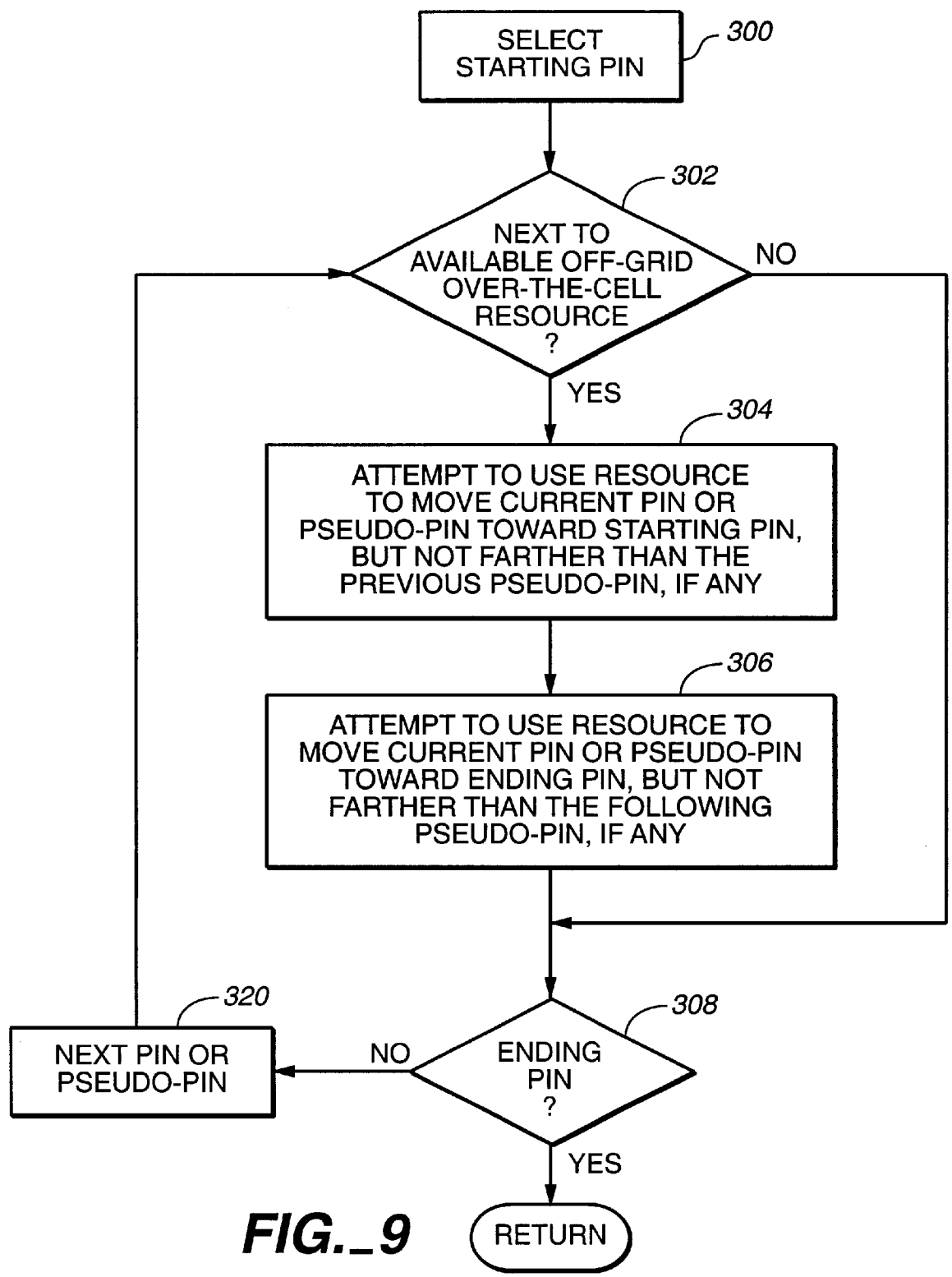
FIG._9

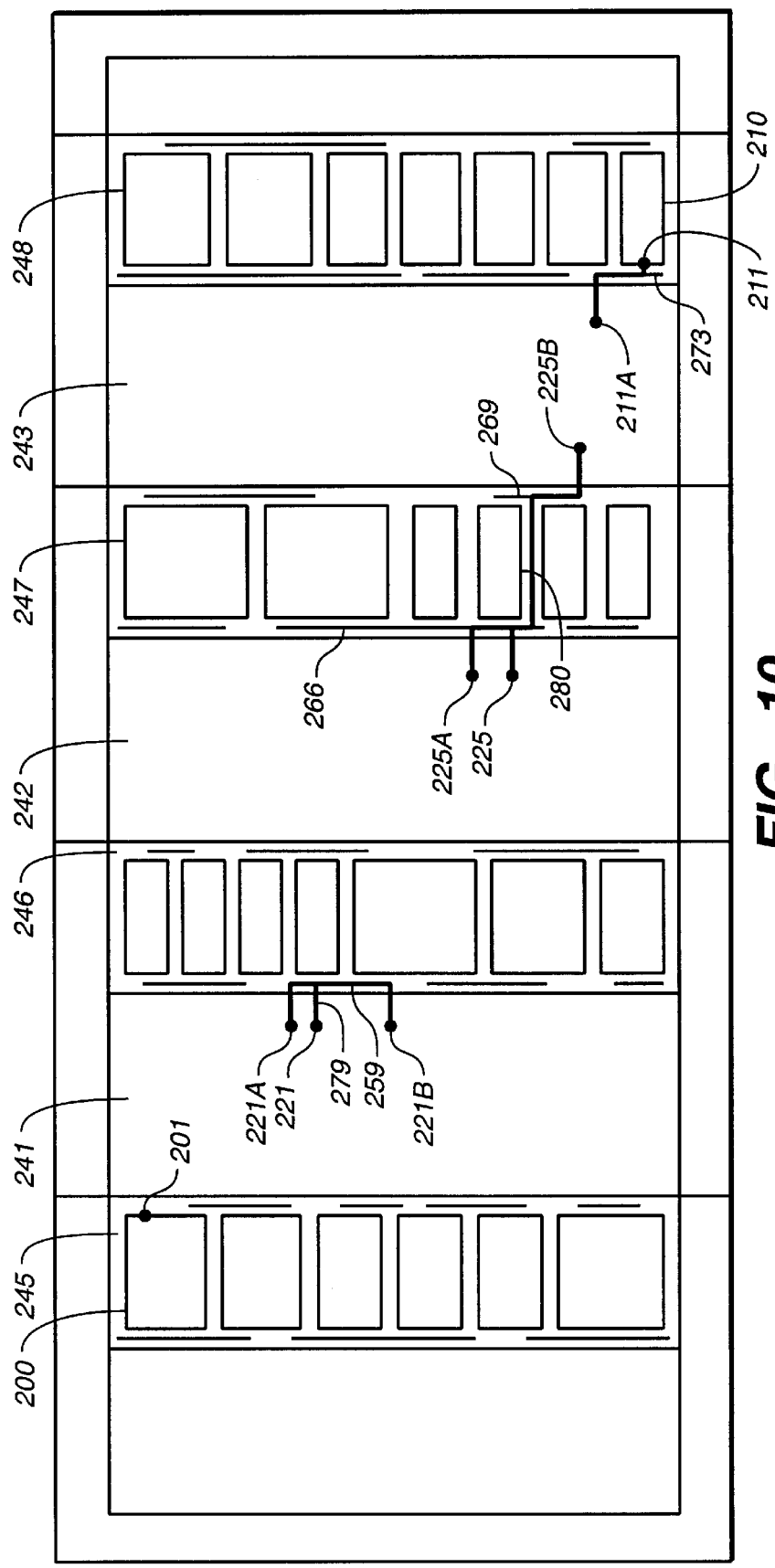
FIG._10

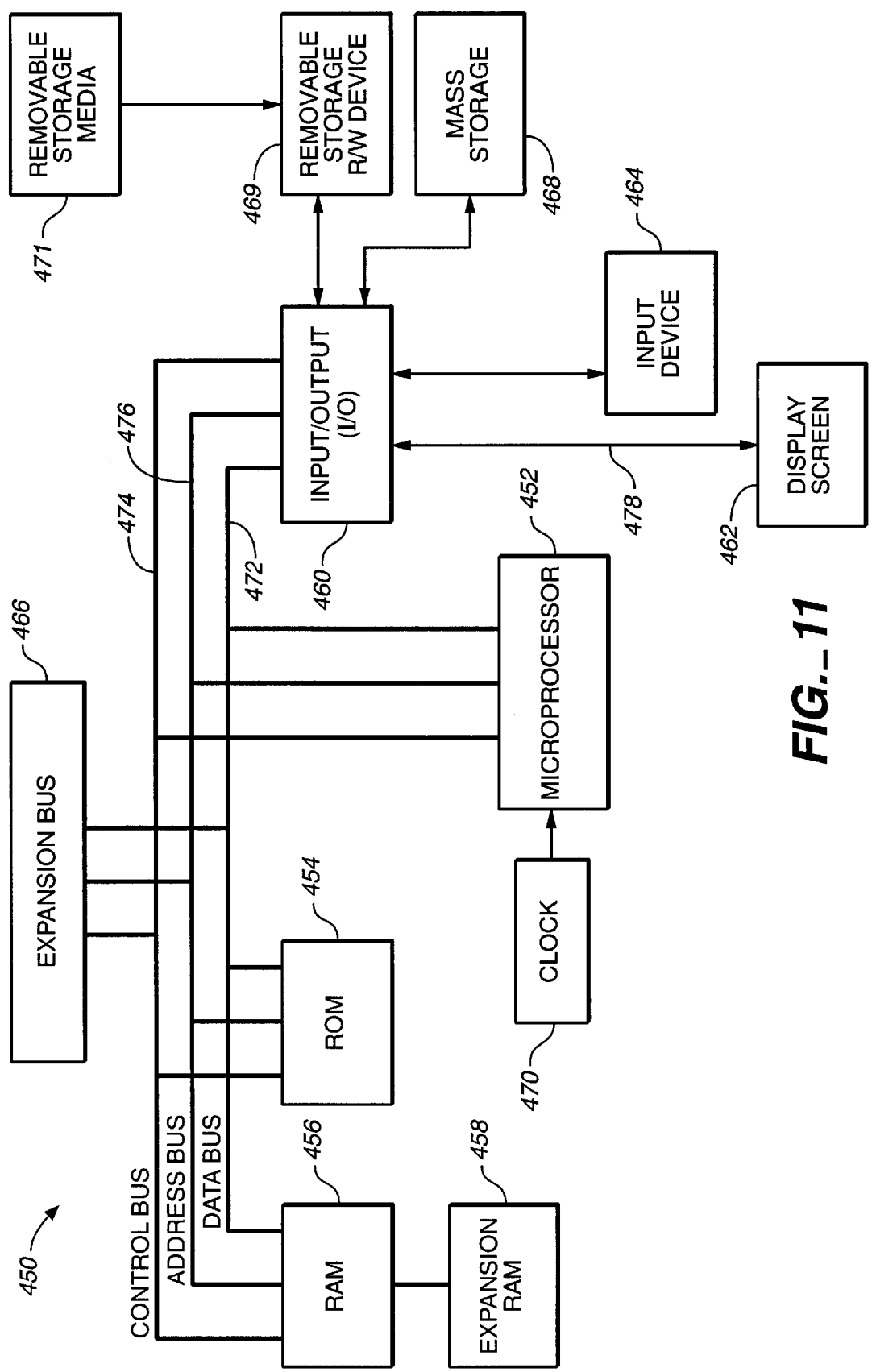
FIG._11

US 6,338,972 B1

OFF-GRID METAL LAYER UTILIZATION

This application is a division or Ser. No. 09/183,292 filed Oct. 30, 1998 now U.S. Pat. No. 6,179,742.

BACKGROUND OF THE INVENTION

1. Field of the Invention

The present invention concerns integrated circuits (ICs) and IC design, and particularly relates to the utilization of off-grid metal layer resources on an integrated circuit.

2. Description of the Related Art

FIG. 1 provides a simplified cross-sectional view of an integrated circuit chip (or die) 10, which includes a semiconductor layer 5, three metal layers 1 to 3, electrically insulating layers 7, and passivation layer 8. Semiconductor layer 5, which is typically polysilicon, is used for forming the transistors and other electronic devices and also may be used for routing some of the electrical connections between these electronic devices. However, wire routing occupies space on the semiconductor layer 5 which otherwise could be used for the electronic devices. As a result, ordinarily only the shorter electrical connections are formed on semiconductor layer 5. For the remainder of the connections, metal layers 1 to 3 are provided.

Metal layers 1 to 3 may be formed from any of a variety of materials including aluminum, copper or an electrically conductive alloy. Typically, two to four metal layers are formed on top of semiconductor layer 5. To simplify the routing process, routing typically is performed using mainly horizontal and vertical trace (or wire) segments. Moreover, to permit such routing to be performed in an orderly manner, each metal layer typically is designated as either a horizontal metal layer or a vertical metal layer. Horizontal metal layers are used primarily for horizontal wire segments and vertical metal layers are used primarily for vertical wire segments. By routing wires in the metal layers 1 to 3, electrical connections can be made without using valuable space on semiconductor layer 5. Between metal layers 1 and 2, between metal layers 2 and 3, and between metal layer 1 and semiconductor layer 5 is an electrically insulating layer 7, which typically is formed as an oxide film. Connections between metal layers or between the metal layers and connections between a metal layer, other than metal layer 1, and semiconductor layer 5 are made using interlayer holes called vias. Direct contacts are made between semiconductor layer 5 and metal layer 1.

Passivation layer 8 functions to prevent the deterioration of the electrical properties of the die caused by water, ions and other external contaminants. Typically, passivation layer 8 is made of a scratch-resistant material such as silicon nitride and/or silicon dioxide.

FIG. 2 provides a representational illustration of the layout of the logic portion 20 of integrated circuit die 10. Logic portion 20 generally is located at the interior of die 10. Typically, along the periphery of the IC die are I/O buffer cells (not shown) for interfacing with devices external to die 10. As shown in FIG. 2, logic portion 20 is bordered by a power (VDD) ring 21 and a ground (VSS) ring 22. Vertical power rails 24 bring power and vertical ground rails 25 bring ground to the internal logic electronic components from the power ring 21 and ground ring 22, respectively. Specifically, as shown in FIG. 2, various logic cells 27 are arranged in cell columns 28, with each cell column 28 being bordered by a power rail 24 and a ground rail 25. Although FIG. 2 shows a significant gap between cell columns 28, the actual gap may in fact be much smaller. Overlaying cell columns 28 are channels 29. For example, each channel 29 may be defined as the space from the left side of one cell column 28 to the left side of the next cell column 28.

Each cell 27 includes one or more predetermined gates, flip-flops and/or other basic electronic devices. Also as shown in FIG. 2, each cell 27 typically has a standard width, although its length may be different from that of other cells. Although interior portion 20 is referred to herein as the logic portion of the IC and cells 27 are referred to herein as logic cells, this terminology is used merely to distinguish those cells from the I/O buffer cells. It should be understood that certain cells 27 may include some or all non-logic processing, such as analog signal processing.

Power and ground rings 21 and 22 and power and ground rails 24 and 25 usually are formed on the die's metal layers. In certain implementations, vertical wire segments are formed on metal layers 1 and 3 and horizontal wire segments are formed on metal layer 2 in addition to supplying power and ground, metal layers 1 to 3 also are used for routing electrical connections for carrying signals between and within the cells 27.

In the layout described above, in which cell columns are used, the routing problem typically is separated into intra-column and inter-column routing. In intra-column routing, electrical connections are routed between electronic components in the same cell column, while in inter-column routing electrical connections are routed between cells in different cell columns. The routing problem is divided in this manner because the considerations involved in intra-column routing are usually different than the considerations involved in inter-column. Most of these considerations arise from the fact that a greater proportion of intra-column routing is performed over cells, as compared with inter-column routing. In addition because direct contacts can be formed between semiconductor layer 5 and metal layer 1, there is no need to use vias, which typically occupy additional space, when routing over cells on metal layer 1. Because most of intra-column routing is over cells, it is often preferable to perform as much intra-column routing on metal layer 1 as possible. Moreover, routing over cells often imposes additional wire spacing requirements, such as limitations on routing over noise-sensitive circuitry.

Thus, in one conventional technique metal layer 1 initially is used for intra-column routing. This technique is illustrated in FIG. 3A, which depicts intra-column routing on metal layer 1 for a single cell column 40. Because point-to-point routing is performed entirely on metal layer 1, horizontal trace segments, as well as vertical trace segments, are implemented on metal layer 1, even though metal layer 1 is designated as a vertical metal layer. Moreover, metal layer 1 intra-column routing is performed independently of the grid used for cell placement and inter-column routing (as described below). In this regard, due to the absence of vias, the relatively fewer pins to connect and relatively smaller area in which to connect them, and the desire to perform as much intra-column routing as possible on metal layer 1, the inefficiencies of grid-based routing generally are thought to outweigh its advantages for this purpose. For reference purposes, vertical grid lines 42 used for placement and inter-column routing (discussed below) are shown in FIG. 3A. Corresponding horizontal grid lines also exist but are omitted from FIG. 3A for the sake of clarity.

In FIG. 3A, electrical connections are routed between the pins of cells 45, 46 and 47, as well as internally within those cells. As shown in FIG. 3A, routing is performed in a manner which tends to make the most efficient use of metal layer 1, independent of the grid lines. Thus, for example, pin 50 of cell 46 is connected to pin 52 of cell 47 using a wire trace which consists of vertical wire segment 54A, horizontal wire segment 54B and vertical wire segment 54C. As indicated above, each of segments 54A, 54B and 54C is implemented on metal layer 1.

FIG. 3B illustrates inter-column routing in this technique. As shown in FIG. 3B, inter-column routing is generally grid-based, meaning that the axial line of each wire segment generally is required to lie along a grid line in a predetermined, regularly spaced rectangular grid. Use of such grid-based routing often greatly simplifies the routing problem. Thus, as shown in FIG. 3B, the axial line of each inter-column wire segment is coincident with one of the vertical grid lines 42 or the horizontal grid lines 43. In this particular implementation, metal layers 1 and 3 are vertical metal layers and metal layer 2 is a horizontal metal layer. Accordingly, the horizontal inter-column wire segments 41 are implemented using on-grid resources on metal layer 2. Similarly, the vertical inter-column wire segments. 41 are implemented using on-grid resources on metal layers 1 and 3. However, inter-column routing is performed after metal layer 1 intra-column routing, and ordinarily there will be little if any on-grid over-the-cell resources on metal layer 1 after completion of metal layer 1 intra-column routing. As a result, mainly the channel portions of metal layer 1 are used in inter-column routing.

One example of inter-column routing shown in FIG. 3B is trace 67 between pin 64 of cell 61 and pin 65 of cell 62. Trace 67 consists of horizontal wire segment 67A, vertical wire segment 67B and horizontal wire segment 67C. Segments 67A and 67G are implemented on metal layer 2, while segment 67B is implemented on either metal layer 1 or metal layer 3.

In addition to performing inter-column routing, this step also performs intra-column routing, in a similar manner to the inter-column routing, for any intra-column connections not capable of being completed in the metal layer 1 intra-column routing step described above. That is, any such pins are connected by using on-grid channel-routing. For instance, a connection is routed between pin 74 of cell 71 and pin 75 of cell 72, both in cell column 70, by routing a horizontal wire segment 76A from pin 74 into adjacent channel 80, routing a vertical wire segment 76B in channel 80, and then routing another horizontal wire segment 76C to pin 75. Segments 76A and 76C are routed on horizontal metal layer 2 and segment 76C is routed on either vertical metal layer 1 or vertical metal layer 3. Vias connect segment 76A to pin 74, segment 76B to segment 76A, segment 76C to segment 76B, and pin 75 to segment 76C.

The foregoing routing technique of performing intra-column routing on metal layer 1 independently of the grid and then grid-based routing for all remaining connections provides good metal utilization for both over-the-cell and channel routing in many cases. However, an even more efficient metal utilization technique is desired. Specifically, the conventional techniques sometimes result in a situation in which a particular cell layout can not be routed. In these situations, adjustments to cell layout generally must be made and then routing retried, thus lengthening the design process. In other cases when using such conventional techniques, the die size must be increased to provide sufficient space for wire routing, thereby increasing the cost of the resulting integrated circuit.

SUMMARY OF THE INVENTION

The present invention addresses the foregoing problems by routing an electrical connection between cells in different cell columns by identifying and using an available off-grid resource within a cell column.

Thus, in one aspect the invention is directed to routing of electrical connections between cells arranged in cell columns on an integrated circuit (IC) die. Electrical connections are routed on a routing layer between cells located in a first cell column. An identification is made of an available off-grid resource capable of being used for wire routing that is both within the first cell column and on the routing layer. An electrical connection is routed between a first cell and a second cell located in different cell columns using at least a portion of the identified available off-grid resource.

In another aspect, the invention is directed to routing electrical connections between cells arranged in cell columns on an integrated circuit (IC) die. Electrical connections are routed on a routing layer between cells located in a first cell column. An identification is made of an available off-grid resource capable of being used for wire routing that is both within the first cell column and on the routing layer. An electrical connection is routed between a first cell and a second cell located in different cell columns, using grid-based routing in a channel between the first cell and the second cell and using at least a portion of the identified available off-grid resource.

By virtue of the foregoing arrangements, additional resources often can be used for routing. As a result, the invention may provide a technique for routing layout designs which are not capable of being routed using certain conventional techniques. Moreover, by increasing the likelihood of obtaining a routing solution, the present invention can avoid the necessity of re-designing the layout in certain cases, thereby reducing design time and cost.

In more particularized aspects of the invention, the identified off-grid resource is used to move a pseudo-pin generated in global routing. By utilizing the identified off-grid resource in this manner, the present invention can provide additional routing resources frequently without significant changes to the existing routing process.

The present invention also addresses the prior art problems discussed above by providing an integrated circuit die which includes an electrical connection having an on-grid wire segment in a channel and an off-grid wire segment formed in a cell column.

Thus, according to a still further aspect, the invention is directed to an integrated circuit die which includes vertical power rails and vertical ground rails. Cell columns, including a first cell column and a second cell column, are each bordered by a vertical power rail and a vertical ground rail. A channel is provided between the first cell column and the second cell column. An electrical connection is provided between a first electronic component in the first cell column and a second electronic component in the second cell column. The electrical connection includes an on-grid wire segment in the channel between the first cell column and the second cell column and an off-grid wire segment formed in one of the cell columns.

By utilizing on-grid and off-grid resources in the foregoing manner, an integrated circuit according to the present invention frequently can be both relatively easy and efficient to route.

The foregoing summary is intended merely to provide a brief description of the general nature of the invention. A more complete understanding of the invention can be obtained by referring to the claims and the following detailed description of the preferred embodiments in connection with the accompanying figures.

BRIEF DESCRIPTION OF THE DRAWINGS

FIG. 1 provides a cross-sectional view of an integrated circuit die.

FIG. 2 illustrates one example of layout in an integrated circuit die.

FIGS. 3A and 3B illustrate conventional intra-column and inter-column routing techniques, respectively.

FIG. 4 is a flow diagram for explaining integrated circuit design according to a representative embodiment of the invention.

FIG. 5 is a flow diagram for explaining physical design according to a representative embodiment of the invention.

FIG. 6 is a flow diagram for explaining routing according to a representative embodiment of the invention.

FIGS. 7A and 7B illustrate a method for identifying off-grid over-the-cell resources according to a preferred embodiment of the invention.

FIG. 8 illustrates the output of the global routing step for one net according to a representative embodiment of the invention.

FIG. 9 is a flow diagram for explaining pre-processing of the global routing output according to a preferred embodiment of the invention.

FIG. 10 illustrates one example of the pre-processing global routing output according to a preferred embodiment of the invention.

FIG. 11 is a block diagram of a general purpose computer system, representing one suitable computer platform for implementing the methods of the invention.

DETAILED DESCRIPTION OF THE PREFERRED EMBODIMENTS

FIG. 4 illustrates a flow diagram for providing a brief overview of IC chip design according to a representative embodiment of the invention. Briefly, according to FIG. 4, an IC design specification is prepared; a functional description of a system corresponding to the design specification is produced; a gate-level circuit description is synthesized from the functional description; a simulation is performed to verify the feasibility of the gate-level description; and physical design is performed.

In more detail, in step 100 an IC design specification is prepared. At this initial step of the design cycle, the desired system design is described in the highest level of abstraction. Subsequent steps in the design cycle provide successively more detail until all information required to fabricate the chip has been derived. Preferably, the design specification dictates features such as performance criteria, required external interfaces and protocols, and product cost targets.

In step 102, a functional design is produced. The functional design describes a system that will satisfy the IC design specification prepared in step 100. Preferably, the functional design is written using a highly structured syntax so as to permit subsequent steps in the design cycle to be performed using automated computer-aided design tools. More preferably, the functional design is written in a hardware description language (HDL) such as VHDL (IEEE standard 1076-1993) or Verilog-HDL.

In step 104, a description of a gate-level circuit is synthesized based on the HDL code produced in step 102. Preferably, gate-level design is performed by running an automated synthesis tool on the HDL code. Upon execution of the synthesis tool, physically realizable gates and flip-flops are selected from a pre-defined library and are interconnected in a manner so as to satisfy the relationships and to perform the processing defined by the HDL code. Processing by the synthesis tool preferably utilizes pre-defined user design constraints which have been formulated in an effort to enhance the feasibility of the design, particularly with respect to problems which might otherwise not be discovered until later in the design cycle. The format of the gate-level circuit description synthesized in step 104 is a "netlist", which categorizes a number of "nets", each including one or more gates and/or flip-flops, and which also describes the interconnections between these nets.

In gate-level verification step 106, a computer simulation is run to test the circuit design synthesized during gate-level design step 104. The goals of this simulation are to determine whether all performance criteria have been met and whether any timing or other circuit errors will occur in response to a variety of different input signals and conditions. Upon completion of gate-level verification in step 106, the netlist is provided to physical design step 108, and a dump of top-level signals in the netlist is provided to the user.

In physical design step 108, the netlist generated in step 106 is mapped to information for physically implementing the corresponding circuit on an IC die. The objective of physical design is to determine an optimal arrangement of devices in a plane or in a three-dimensional space, and an efficient interconnection or routing scheme between the devices to obtain the desired functionality. One goal of physical design step 108 is to implement the design using minimum chip area. Other factors considered during physical design include thermal generation, power/ground noise, electromagnetic effects, and the number of metal layers available for wire routing.

Step 108 produces a set of design files in an unambiguous representation known as an intermediate form that describes the layout. The design files are then converted into pattern generator files that are used to produce patterns called masks by an optical or electron beam pattern generator. A representative embodiment of physical design step 108 is discussed in more detail below in connection with FIG. 5.

It should be noted that while one example of a particular design cycle is described above, variations of the foregoing may also be used, as will be apparent to those skilled in the art. In addition, although the foregoing design process is described above and shown in FIG. 4 as being purely sequential, many times one or more of the steps will need to be repeated. That is, if the design is found to be unfeasible at one step, an earlier step might need to be re-executed in order to correct the problem. For example, it might occur that in step 104 a gate-level description can not be generated to satisfy the functional design requirements using the available technology library, while at the same time maintaining the user's design constraints. In this case, the functional description may need to be redesigned in step 102 in order to achieve a feasible design.

Physical Design

A more detailed discussion of physical design step 108 (shown in FIG. 4) in the preferred embodiment of the invention will now be discussed with reference to the flow diagram shown in FIG. 5. Briefly, according to FIG. 5, cells are obtained based on the supplied netlist; I/O cells and associated bonding pads are laid out around the periphery of the die; interior logic cells and power/ground rails are laid out; traces are routed between the cells; and compaction is performed.

In more detail, in step 130 cell descriptions are obtained from a cell library based on the netlist input from step 106.

Specifically, logic and other signal processing cells, as well as I/O buffer cells, are obtained corresponding to the circuits identified in the netlist.

In step 132, the I/O buffer cells and associated bonding pads are laid out (or placed) around the periphery of the die. As used herein, layout or placement refers to generating layout or placement information. During device fabrication, electronic devices and wires are formed on the IC die using the placement information generated during physical design.

In step 134, the logic cells are placed at the interior of the die. A main concern in performing this placement is to reduce spacing between cells, thereby minimizing the amount of wire routing that will need to be performed. The main sub-steps in performing step 134 are partitioning, floorplanning and layout.

The logic portion of a chip may contain several million transistors. As a result, layout of the entire chip generally cannot be handled due to the limitations of available memory space and computation power. Therefore, the logic circuitry normally is partitioned by grouping circuit components into blocks, such as subcircuits and modules. The actual partitioning process considers many factors such as the size of the blocks, number of blocks and number of interconnections between the blocks.

The output of partitioning is a set of blocks, together with the interconnections required between these blocks. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement are concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement typically is done in two phases. In the first phase, an initial placement is created. In the second phase, the initial placement is evaluated and iterative improvements are made until the layout has minimum area and conforms to design specifications.

In step 136, traces are routed from the I/O cells and interior logic cells to other I/O and interior logic cells, as well as to power and ground rings. The objective of routing is to complete all the interconnections between cells and within each cell according to the specified netlist, subject to the space available for routing. Another goal of routing is to complete all circuit connections using the shortest possible wire length. Routing is discussed in more detail below in connection with FIG. 6.

In step 138, compaction is performed. Compaction is the process of compressing the layout in both directions such that the total area is reduced. By making the chips smaller, wire lengths are reduced, which in turn reduces the signal delay between components of the circuit. At the same time, a smaller area enables more chips to be produced on a wafer, which in turn reduces the cost of manufacturing. Compaction must ensure that no rules regarding the design and fabrication processes are violated.

While the foregoing implementation of physical design step 108 is preferable, other variations apparent to those skilled in the art may also be used. Moreover, although the steps are described above and shown in FIG. 5 as being entirely sequential, it should be understood that feasibility problems discovered in any one of the steps frequently will require repeating a prior step. For example, routing problems discovered in step 136 might require adjustments to layout byte-executing portions of step 134.

Routing

Trace routing step 136 (shown in FIG. 5) will now be described in more detail in connection with the flow diagram shown in FIG. 6. Briefly according to FIG. 6, intra-column routing is performed, the die is searched for off-grid over-the-cell resources, global routing is performed, the results of global routing are pre-processed using the identified off-grid over-the-cell resources, and detailed routing is performed. As used herein, "over-the-cell" means within a cell column.

In more detail, in step 150 metal layer 1 intra-column routing is performed. As in the conventional technique described above, metal layer 1 intra-column routing in the preferred embodiment utilizes metal layer 1 in an attempt to achieve an efficient routing pattern regardless of any grid used for layout or for inter-column routing. In addition, step 150 routes horizontal, as well as vertical, wire segments on metal layer 1. Preferably, this step is performed using an automated design tool such as LSI Logic's Stub Router.

In step 152, a search is made to identify off-grid resources within a cell column that can be used for placing a wire. In the preferred embodiment, this step is performed by first identifying a horizontal position x corresponding to a minimum horizontal distance into the cell column from a rail bordering the cell column at which a wire could be placed in metal layer 1 without violating wire spacing requirements. For example, with respect to a rail bordering the cell column on the left, $$x = x_r + \frac{1}{2}w_r + \frac{1}{2}w_w + S_{\min}$$

and, with respect to a rail bordering the cell column on the right, $$x = x_r - \frac{1}{2}w_r - \frac{1}{2}w_w - S_{\min}$$

where $X_r$ is the horizontal position of the center of the rail, wr is the width of the rail, $W_w$ is the width of the desired wire and $S_{min}$ is the minimum wire-to-wire spacing requirement.

Next, for each x identified the entire length of the cell column is scanned to determine ranges of vertical positions y for which (x,y) represents a valid location for a wire. In the preferred embodiment, invalid positions include locations where the minimum wire spacing requirement would be violated with respect to any other wire segment in the cell column or where wire segments are prohibited, such as by a route-block command included in a cell having noise-sensitive circuitry. Finally, any identified ranges of y which are shorter than the required minimum wire length are discarded. This approach is used to identify off-grid over-the-cell resources immediately inside each rail of each cell column on the die.

An example of the preferred embodiment of this step is illustrated in FIGS. 7A and 7B. Specifically, FIG. 7A illustrates a cell column 180 bordered by a power rail 181 and a ground rail 182. Initially, an x position 185 is determined with respect to rail 181 and an x position 186 is determined with respect to rail 182. As noted above, x position 185 is the minimum spacing from rail 181 at which a wire could be placed without violating the minimum spacing requirement from rail 181. Similarly, x position 186 is the minimum spacing from rail 182 at which a wire could be placed without violating the minimum spacing requirement from rail 182. Next, the valid y positions are determined for each of x positions 185 and 186. In the present example there are no route-block commands present. Accordingly, the only invalid y positions are those which are too close to another wire. As to x position 185, this means the y range of wire segment 191, and as to x position 186, this means the y range of wire segment 192. Therefore, this step will identify two y ranges 195 and 196 for x position 185 and two y ranges 197 and 198 for x position 186, as indicated in FIG. 7B.

Returning to FIG. 6, in step 154 global routing is performed for any pins not connected in step 150, i.e., all pins used for inter-column connections and any intra-column connection pins which were not connected in step 150. On a typical IC die, thousands or tens of thousands of pins will need to be interconnected. To cope with such complexity, global routing disregards the exact geometric details of each wire and terminal and instead merely finds a list of channels that are to be used as a passageway for each wire. In other words, global routing specifies the loose route of a wire through different regions of the routing space. Various techniques exist for performing global routing, and are well documented in the art, such as Steiner Tree based techniques and hierarchical techniques. In the preferred embodiment, the output of global routing step 154 is a set of pseudo-pins which act as guides for the subsequent step of detailed routing. More preferably, global routing step 154 specifies a pseudo-pin for each cell column between the cell column containing the first pin to be connected and the cell column containing the second pin to be connected. FIG. 8 illustrates the output of this step.

Specifically, FIG. 8, shows an example of two pins to be connected, pin 201 on cell 200 and pin 211 on cell 210. On completion of step 154, pseudo-pins 221 and 225 are specified. As shown in FIG. 8, pseudo-pin 221 is on the border between channel 241 and channel 242; similarly, pseudo-pin 25 is on the border between channels 242 and 243. Using these pseudo-pins, a detailed router could attempt to complete the connections between pins 201 and 211 by routing a connection between pin 201 and pseudo-pin 221 in channel 241, a connection between pseudo-pin 221 and pseudo-pin 225 in channel 242, and a connection pseudo-pin 225 and pin 211 in channel 243. Also shown in FIG. 8 are off-grid over-the-cell metal layer 1 resources 251 to 275 which were identified in step 152.

Returning again to FIG. 6, in step 156 the output of the global router is pre-processed using the resources identified in step 152, so as to simplify the task of the detailed router. In the preferred embodiment, this pre-processing involves using those resources to effectively move the pseudo-pins output by the global router so that the required in-channel routing by the detailed router is reduced. More preferably, the identified off-grid over-the-cell resources are used to move the pins or pseudo-pins in each channel closer together, thereby simplifying the total routing length required to be performed by the detailed router. As used herein, the term "pin" is meant to include pseudo-pins as well as cell pins.

A representative technique for performing this step will now be discussed with reference to FIG. 9. Specifically, FIG. 9 illustrates a flow diagram for explaining a method for performing step 156 with respect to two pins to be connected, where the starting pin is a pin on the left side of the die and the ending pin is a pin on the right side of the die. Briefly, according to FIG. 9, the starting pin is selected; the current pin is checked to determine whether it is adjacent to an available off-grid over-the-cell resource; if so, an attempt is made to move the current pin; the foregoing process is then repeated for each successive pin up to and including the ending pin.

In more detail, in step 300 the starting pin initially is selected as the current pin.

In step 302, it is determined whether the current pin is adjacent to an available off-grid over-the-cell resource identified in step 152. If so, processing proceeds to step 304; otherwise, processing skips to step 320. For purposes of this step, the current pin is adjacent to an available off-grid over-the-cell resource if there is such a resource in the corresponding cell column at the same vertical position as the current pin. In this embodiment, the corresponding cell column generally will be the cell column in which the current pin is located or the cell column to the immediate right of the current pin, in the event the current pin is a pseudo-pin.

In step 304, an attempt is made to move the current pin vertically toward the starting pin by routing on the available off-grid over-the-cell resources adjacent to the current pin. However, the current pin is not moved farther than the previous pin. For instance, if the starting pin is vertically higher than the current pin and the off-grid over-the-cell resource extends vertically up, then a wire is routed in the available over-the-cell resources, so as to move the current pin higher, to a point which is the lower of the starting pin and the previous pin.

In step 306, an attempt is made to move the current pin vertically toward the ending pin by routing a wire on the available off-grid over-the-cell resource adjacent to the current pin. The movement of the next pin is limited to a vertical position not beyond the pin following the next pin. Thus, if the ending pin is lower than the current pin and if the off-grid over-the-cell resource extends downward, the current pin is moved downward to a point which is the higher of the ending pin and the pin following the current pin.

It is noted that after steps 304 and 306 the current pin may have been moved in either zero, one or two directions. If no movement has been performed, then the current pin remains unchanged. If the current pin has been moved in one direction, then two pins result: the current pin and the current pin as moved, with these two pins connected by a wire segment routed on at least one available off-grid over-the-cell track. Both such pins will be provided to the detailed router. If the current pin has been moved in two directions, two new pins result: the current pin as moved in each direction, with these two new pins connected by a wire segment routed on at least one available off-grid over-the-cell track. Both such new pins will be provided to the detailed router in place of the current pin.

In step 308, it is determined whether the current pin is the ending pin. If not, processing proceeds first to step 320 to select the next pin as the current pin and then to step 302 to repeat the process for the new current pin. In this embodiment, pins are processed in the order from left to right; accordingly, the next pin is the first pin to the right of the current pin. If the current pin is the ending pin, then step 156 is completed.

An example will illustrate the foregoing process. FIG. 10 illustrates the global routing output shown in FIG. 8 after pre-processing as described above. In FIG. 10, each of the pins 201, 221, 223, 225, 227 and 211 have been processed in sequence. In this example, it is assumed that the die uses three metal layers, metal layers 1 to 3.

Starting pin 201 is not adjacent to an off-grid over-the-cell resource, and therefore is not moved. Pseudo-pin 221 is adjacent to resource 259 and resource 259 extends both upward and downward from pseudo-pin 221. Therefore, in step 304 pseudo-pin 221 is moved up to position 221A.

When using a three metal layer die, the pseudo-pins typically will be located on metal layer 2, the horizontal metal layer. Accordingly, a horizontal wire 279 is routed on metal layer 2 from pseudo-pin 221 into cell column 246, to a position just inside of (to the right of) the x position for the available off-grid over-the-cell resource. A via is then inserted to connect metal layer 2 to metal layer 1 at this point. It is noted that it is typically necessary to go slightly inside of the x position of the off-grid over-the-cell resource because a via typically is wider than a wire. In this example, we also assume, in order to simplify the discussion, that a via can be placed at any position along each identified off-grid over-the-cell resource without violating a spacing requirement. In actual implementation, however, this will not always be true because the identification in step 152 only required that the resources be capable of containing a wire, which generally will be narrower than via. Thus, in actual implementation, the length of a particular wire routed on the off-grid over-the-cell resource may need to be shortened until a suitable location is found for a via. By utilizing resource 259 in this manner, pseudo-pin 221 can be moved to position 221A. In a similar manner, because resource 259 also extends downward, in step 306 pseudo-pin 221 also can be moved downward to position 221 B. Pins 221A and 221B will be output in place of pin 221.

The next pseudo-pin 225 is adjacent to resource 266. Because resource 266 extends upward, pseudo-pin 225 can be moved upward in a manner similar to pin 221 above. However, the upward movement of pin 225 is limited to the vertical position of previous pseudo-pin 221B, i.e., to position 225A. Resources 266 and 269 extend downward from current pseudo-pin 225; accordingly, pseudo-pin 225 is moved downward by routing wires on resources 266 and 269, together with a horizontal wire segment 280 (such as on metal layer 2) to a position 225B.

Finally, ending pin 211 is on the left side of cell column 248, and is adjacent to resource 273 which extends upward. Therefore, pin 211 is moved to new position 21 1A by routing a wire on resource 273.

The final output of step 156 in this example includes pins 201, 221A, 221B, 225A, 225B and 211A. As a result of the foregoing pre-processing to move the pins, the pins to be connected within a channel are moved closer together. For example, pseudo-pin 221 has been moved to position 221A which is vertically closer to pin 201. Similarly, pin 221 also has been moved to position 221 B and pin 225 has been moved to position 225A, eliminating all vertical distance between the two.

Returning again to FIG. 6, in step 158 detailed routing is performed. Detailed routing completes point-to-point connections between terminals on the cells using the information provided by the global routing step 154, as modified by the pre-processing step 156. Specifically, the loose routing is converted into exact routing by specifying the geometric information such as width of wires and their layer assignments. In the preferred embodiment, this is accomplished by routing connections between the pairs of pins in each channel for each net. Techniques for detailed routing between pairs of points within the same channel are well known in the art. Thus, with reference to the net shown in FIG. 10, pin 201 is connected to pseudo-pin 221A in channel 241, pin 221B is connected to pin 225A in channel 242, and pin 225B is connected to pin 211A in channel 243. Because each such pair of pins is closer than the original output of global routing step 154, the task of detailed routing in step 158 requires less vertical routing and generally will be more likely to result in a valid solution.

The foregoing embodiment provides one example of a method for identifying and using off-grid over-the-cell resources. However, variations may be made to the foregoing to technique, as will be appreciated by those skilled in the art. For example, the identification of off-grid over-the-cell resources in step 152 may be performed after global routing step 154, rather than before. Moreover, in the above embodiment, pins are moved using off-grid over-the-cell resources. By pre-processing the global routing results in this manner, the invention can be implemented without significant changes to either the global routing step or the detailed routing step. It is noted that both of these steps generally are performed using computer-aided design tools, and therefore it is highly advantageous to improve routing without modifying these tools. However, the pre-processing step 156 could be eliminated and the identified off-grid over-the-cell resources supplied directly to the detailed routing step 158, which in turn would directly use these resources when routing connections.

Fabrication

Upon completion of design, as described above, the integrated circuit can be fabricated using the masks generated in step 108 (shown in FIG. 4), but otherwise employing conventional fabrication techniques. During fabrication, the masks generated in step 108 are used to pattern a silicon wafer using a sequence of photolithographic steps. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

The above-mentioned "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation typically involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes.

Doping generally is achieved with thermal diffusion (wafer is heated and exposed to the desired dopant) and ion implantation (dopant atoms are ionized, accelerated to high velocities and implanted into the wafer surface).

Design System Environment

Generally, the methods described herein with respect to IC design will be practiced with a general purpose computer, either with a single processor or multiple processors. FIG. 11 is a block diagram of a general purpose computer system, representing one of many suitable computer platforms for implementing the methods described above. FIG. 11 shows a general purpose computer system 450 in accordance with the present invention. As shown in FIG. 11, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

CONCLUSION

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶6.

What is claimed is:

1. Computer-executable process steps stored on a computer readable medium, said process steps for routing electrical connections between cells arranged in cell columns on an integrated circuit (IC) die, said process steps comprising:

an intra-column routing step to route electrical connections on a routing layer between cells located in a first cell column;

an identifying step to identify an available resource capable of being used for wire routing that is both within the first cell column and on the routing layer; and an inter-column routing step to route an electrical connection between a first cell and a second cell located in different cell columns using at least a portion of the available resource identified in said identifying step.

2. Computer-executable process steps stored on a computer readable medium, said process steps for routing electrical connections between cells arranged in cell columns on an integrated circuit (IC) die, said process steps comprising:

an intra-column routing step to route electrical connections on a routing layer between cells located in a first cell column;

an identifying step to identify an available resource capable of being used for wire routing that is both within the first cell column and on the routing layer; and an inter-column routing step to route an electrical connection between a first cell and a second cell located in different cell columns, using grid-based routing in a channel between the first cell and the second cell and using at least a portion of the available resource identified in said identifying step.

3. An apparatus for routing electrical connections between cells arranged in cell columns on an integrated circuit (IC) die, said apparatus comprising:

a processor for executing stored program instruction steps; and a memory connected to the processor for storing the program instruction steps, wherein the program instruction steps include: (1) an intra-column routing step to route electrical connections on a routing layer between cells located in a first cell column; (2) an identifying step to identify an available resource capable of being used for wire routing that is both within the first cell column and on the routing layer; and (3) an inter-column routing step to route an electrical connection between a first cell and a second cell located in different cell columns using at least a portion of the available resource identified in said identifying step.

4. An apparatus for routing electrical connections between cells arranged in cell columns on an integrated circuit (IC) die, said apparatus comprising:

a processor for executing stored program instruction steps; and a memory connected to the processor for storing the program instruction steps, wherein the program instruction steps include: (1) an intra-column routing step to route electrical connections on a routing layer between cells located in a first cell column; (2) an identifying step to identify an available resource capable of being used for wire routing that is both within the first cell column and on the routing layer; and (3) an inter-column routing step to route an electrical connection between a first cell and a second cell located in different cell columns, using grid-based routing in a channel between the first cell and the second cell and using at least a portion of the available resource identified in said identifying step.

5. An apparatus for routing electrical connections between cells arranged in cell columns on an integrated circuit (IC) die, said apparatus comprising:

intra-column routing means for routing electrical connections on a routing layer between cells located in a first cell column;

identifying means for identifying an available resource capable of being used for wire routing that is both within the first cell column and on the routing layer; and inter-column routing means for routing an electrical connection between a first cell and a second cell located in different cell columns using at least a portion of the available resource identified in said identifying step, wherein the routing by said inter-column routing means comprises a global routing step of performing a rough routing between the first cell and the second cell by generating a pseudo-pin in a channel between the first cell and the second cell.

6. An apparatus for routing electrical connections between cells arranged in cell columns on an integrated circuit (IC) die, said apparatus comprising:

intra-column routing means for routing electrical connections on a routing layer between cells located in a first cell column;

identifying means for identifying an available resource capable of being used for wire routing that is both within the first cell column and on the routing layer; and inter-column routing means for routing an electrical connection between a first cell and a second cell located in different cell columns, using grid-based routing in a channel between the first cell and the second cell and using at least a portion of the available resource identified in said identifying step, wherein the routing by said inter-column routing means comprises a global routing step of performing a rough routing between the first cell and the second cell and a detailed routing step of performing exact routing between the first cell and the second cell based on an output of the global routing step, and wherein the routing by said inter-column routing means further comprises a preprocessing step of preprocessing the output of the global routing step by utilizing the available resource identified by said identifying means so as to reduce a task of the detailed routing step.

* * * * *